(12) United States Patent
Kim et al.

(10) Patent No.: US 10,276,351 B1
(45) Date of Patent: Apr. 30, 2019

(54) HIGH-FREQUENCY POWER GENERATOR WITH ENHANCED PULSE FUNCTION

(71) Applicants: Newpowerplasma Co., Ltd., Pyoungtak-si, Gyeonggi-do (KR); Sungkyunkwan University Research & Business Foundation, Suwon-si, Gyeonggi-do (KR)

(72) Inventors: Jongwoon Kim, Hwaseong-si (KR); Eunmin Jeon, Asan-si (KR); Youngchul Kim, Osan-si (KR); Minjae Kim, Osan-si (KR)

(73) Assignees: NEWPOWERPLASMA CO., LTD., Pyoungtak-si, Gyeonggi-do (KR); Sungkyunkwan University Research & Business Foundation, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/182,538

(22) Filed: Nov. 6, 2018

(30) Foreign Application Priority Data

Feb. 28, 2018 (KR) .................. 10-2018-0024686

(51) Int. Cl.
  *H01J 37/32* (2006.01)
  *H02M 3/158* (2006.01)
(52) U.S. Cl.
  CPC ..... *H01J 37/32183* (2013.01); *H02M 3/1582* (2013.01)
(58) Field of Classification Search
  None
  See application file for complete search history.

(56) References Cited

U.S. PATENT DOCUMENTS

| 2010/0320978 | A1* | 12/2010 | Hunt | H02M 3/156 |
| | | | | 323/282 |
| 2013/0099590 | A1* | 4/2013 | Ma | H02M 3/3388 |
| | | | | 307/104 |
| 2013/0099788 | A1* | 4/2013 | Xu | G01R 33/3852 |
| | | | | 324/322 |
| 2016/0066405 | A1* | 3/2016 | Habu | H05H 1/46 |
| | | | | 315/224 |
| 2016/0087547 | A1* | 3/2016 | Yamada | H02M 1/12 |
| | | | | 318/400.3 |
| 2016/0308440 | A1* | 10/2016 | Yan | H02M 3/158 |

FOREIGN PATENT DOCUMENTS

KR   10-0822390 B1   4/2008

* cited by examiner

*Primary Examiner* — Jany Richardson
(74) *Attorney, Agent, or Firm* — Rabin & Berdo, P.C.

(57) ABSTRACT

Provided is a high-frequency power generator with an enhanced pulse function, which supplies high-frequency power to a plasma load. The high-frequency power generator may include: a rectifier configured to receive AC power and rectify the received AC power; a DC-DC converter configured to adjust an output voltage by switching an output of the rectifier; an RF power amplifier configured to amplify an output of the DC-DC converter, and transfer high-frequency power with a pulse waveform to the plasma load; an RF power controller configured to control the output and pulse waveform of the RF power amplifier; and a DC-DC converter controller configured to receive a pulse signal from the RF power controller, and control a duty ratio of switching elements constituting the DC-DC converter.

6 Claims, 5 Drawing Sheets

HIGH-FREQUENCY POWER GENERATOR WITH ENHANCED PULSE FUNCTION

BACKGROUND

1. Technical Field

The present disclosure relates to a high-frequency power generator that supplies high-frequency power to a plasma load, and more particularly, to a high-frequency power generator with an enhanced pulse function, which can adjust the waveform of a PWM signal applied to switching elements of a DC-DC converter adaptively to a pulse output of an RF power amplifier, thereby stabilizing an output and preventing an overshoot or undershoot in a pulse period.

2. Related Art

In general, plasma discharge is used for gas excitation to generate active gas containing ions, free radicals, atoms and molecules. The active gas is widely used in various fields, and representatively used in a semiconductor fabrication process including etching, deposition and cleaning processes.

The plasma processing device includes a high-frequency power generator for generating high-frequency power, an impedance matching box for supplying the maximum power, and a plasma load. The high-frequency power generator generates RF power at a high frequency, and the impedance matching box matches the output terminal impedance of the high-frequency power generator with the impedance of the plasma load, such that desired high-frequency power is applied to a processing chamber.

The high-frequency power generator includes a rectifier for converting commercial power into DC power, a DC-DC converter for generating a voltage-controlled output by switching an output of the rectifier, and an RF power amplifier for outputting high-frequency power by amplifying the output of the DC-DC converter.

Recently, a high speed pulse output of the high-frequency power generator is required for a fine semiconductor process. Korean Patent Registration No. 10-0822390 suggests a high-frequency power generator for a plasma generation device, which generates a high speed pulse output.

Referring to the related document, the high-frequency power generator includes a control loop which detects the peak value of a high frequency output, compares the detected peak value to a preset peak value, and controls the peak value of the high frequency output, and a pulse generator which calculates the average value of high frequency outputs through a calculation unit and generates a modulated reference signal based on the calculated average value. The high-frequency power generator generates a high speed pulse output.

However, while the conventional high-frequency power generator handles the continuity of outputs and variations of various loads which are varied in the range of 1 Hz to 50 kHz, an overshoot or undershoot may occur in the pulse output. Such an unstable pulse output may serve as a factor to raise a defect rate in the semiconductor process.

RELATED ART DOCUMENT

Patent Document

Korean Patent Registration No. 10-0822390

SUMMARY

Various embodiments are directed to a high-frequency power generator with an enhanced pulse function, which can generate a PWM waveform to apply to switching elements of a DC-DC converter, using two-stage PI controllers which are controlled adaptively to a pulse output of an RF power amplifier, thereby stabilizing an output and preventing an overshoot or undershoot in a pulse period.

Also, various embodiments are directed to a high-frequency power generator with an enhanced pulse function, which can stably control an input voltage of an RF power amplifier by adjusting gains of two-stage PI controllers according to a frequency.

In an embodiment, there is provided a high-frequency power generator with an enhanced pulse function, which supplies high-frequency power to a plasma load. The high-frequency power generator may include: a rectifier configured to receive AC power and rectify the received AC power; a DC-DC converter configured to adjust an output voltage by switching an output of the rectifier; an RF power amplifier configured to amplify an output of the DC-DC converter, and transfer high-frequency power with a pulse waveform to the plasma load; an RF power controller configured to control the output and pulse waveform of the RF power amplifier; and a DC-DC converter controller configured to receive a pulse signal from the RF power controller, and control a duty ratio of switching elements constituting the DC-DC converter. The DC-DC converter controller may include: a first subtractor configured to calculate a difference between a voltage command received from the RF power controller and the output voltage of the DC-DC converter by comparing the voltage command to the output voltage; a first PI controller configured to proportionally integrate an output of the first subtractor; a second subtractor configured to calculate a difference between an output of the first PI controller and an inductor current flowing through an inductor of the DC-DC converter by comparing the output of the first PI controller to the inductor current; a second PI controller configured to proportionally integrate an output of the second subtractor; a comparator configured to generate a PWM signal by comparing an output of the second PI controller to a carrier frequency, and provide the generated PWM signal to the switching elements constituting the DC-DC converter; and an adaptive controller configured to receive a pulse signal corresponding to the output of the RF power amplifier from the RF power controller, and adjust gains of the first and second PI controllers.

The adaptive controller may compare the frequency of the pulse signal applied from the RF power controller to a first reference frequency, output a first set of gains as the gains of the first and/or second PI controllers when the frequency of the pulse signal is lower than the first reference frequency, and output a second set of gains as the gains of the first and/or second PI controllers when the frequency of the pulse signal is higher than the first reference frequency.

As the frequency of the pulse signal is higher, the gains of the first and/or second PI controllers may be decreased.

DETAILED DESCRIPTION

Hereafter, exemplary embodiments of the present invention will be described with reference to the accompanying drawings. However, the present invention is not limited to the exemplary embodiments, but may include all modifications, equivalents and substitutions without departing from the spirit and scope of the present invention.

Figure 1:
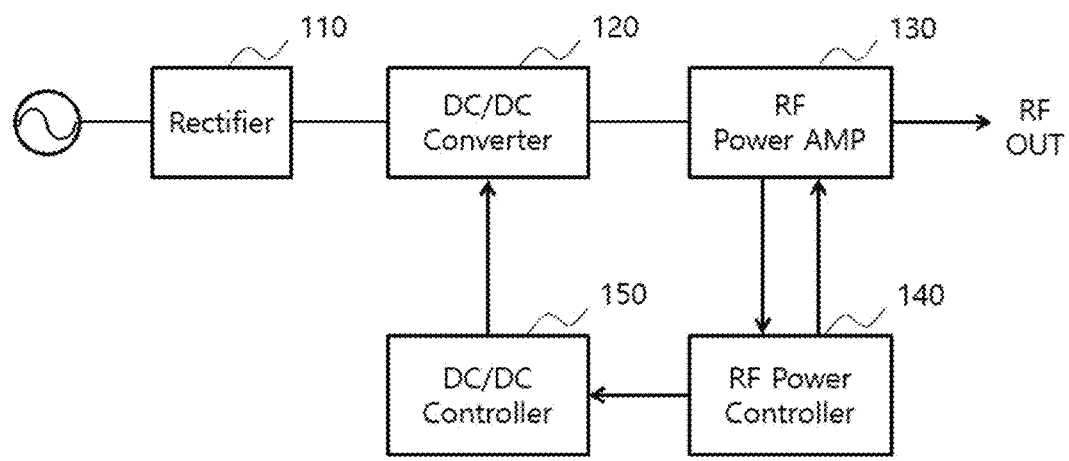
FIG. 1 is a block diagram illustrating a high-frequency power generator in accordance with an embodiment of the present invention.

FIG. 1 is a block diagram illustrating a high-frequency power generator in accordance with an embodiment of the present invention.

Referring to FIG. 1, the high-frequency power generator in accordance with the embodiment of the present invention includes a rectifier 110, a DC-DC converter 120, an RF power amplifier 130, an RF power controller 140 and a DC-DC converter controller 150.

The rectifier 110 rectifies AC power received from a power supplier. For example, the rectifier 110 rectifies the AC power into a DC constant voltage using a bridge diode. The rectified power is supplied to the components constituting the high-frequency power generator. Although not illustrated, an EMI filter for removing electromagnetic noise may be further installed at an input terminal of the AC power.

The DC-DC converter 120 converts the output of the rectifier 110 into a predetermined level of DC voltage by switching the output of the rectifier 110. In the present embodiment, the DC-DC converter 120 may be configured as a cascade buck-boost converter.

The RF power amplifier 130 generates high-frequency power with a pulse waveform by amplifying the predetermined level of DC voltage outputted from the DC-DC converter 120. The generated high-frequency power is transferred to a plasma load during a semiconductor process or the like. The RF power amplifier 130 may include two or more power generators which are operated in parallel to each other, in order to generate voltages and frequencies depending on various load conditions.

The RF power controller 140 controls the output and the pulse waveform of the RF power amplifier 130. For example, the RF power controller 140 may control the phase or frequency of the high-frequency power or control the phase and frequency of the high-frequency power at the same time. Although not illustrated, the RF power controller 140 may sense power reflected from the plasma load, prevent the output of the RF power amplifier 130 from being disturbed by the sensed reflected power, and control the phase and/or frequency in order to maintain the impedance matching state with the plasma load.

The DC-DC converter controller 150 controls the duty ratio of switching elements constituting the DC-DC converter 120. The DC-DC converter controller 150 of the high-frequency power generator in accordance with the embodiment of the present invention may receive a command-value voltage V* and a pulse signal from the RF power controller 140, and stably control an RF pulse output with a frequency and duty ratio in a wide range by adjusting a gain of a PI controller using the pulse signal outputted from the RF power controller 140.

Figure 2:
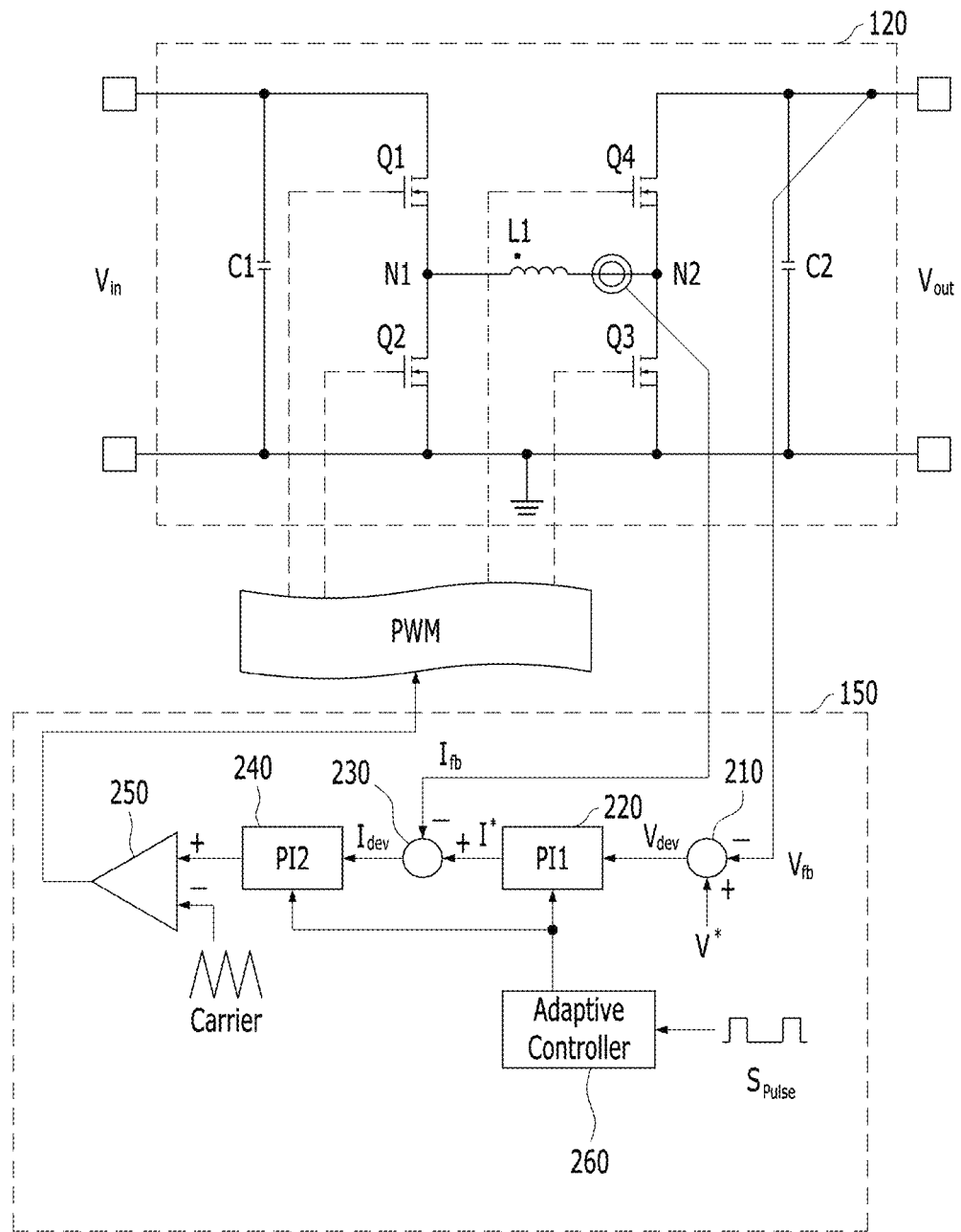
FIG. 2 is a block diagram illustrating a control system of a DC-DC converter controller in accordance with the embodiment of the present invention.

FIG. 2 is a block diagram illustrating the control system of the DC-DC converter controller in accordance with the embodiment of the present invention.

Referring to FIG. 2, the DC-DC converter 120 includes an input capacitor C1 connected in parallel to an input terminal, first and second switching elements Q1 connected in parallel to the input terminal, third and fourth switching elements Q3 and Q4 connected in parallel to an output terminal, an inductor L1 having one terminal connected to a first node N1 between the first and second switching elements Q1 and Q2 and the other terminal connected to a second node N2 between the third and fourth switching elements Q3 and Q4, and an output capacitor C2 connected in parallel to the output terminal.

The DC-DC converter controller 150 includes two-stage PI controllers, and provides a PWM signal to the gate terminals of the first to fourth switching elements Q1 to Q4.

Referring to FIG. 2, the DC-DC converter controller 150 includes a first subtractor 210, a first PI controller 220, a second subtractor 230, a second PI controller 240, a comparator 250 and an adaptive controller 260.

The first subtractor 210 subtracts a feedback voltage Vfb of the DC-DC converter 120 from the command-value voltage V* received from the RF power controller 140, and output a deviation voltage Vdev. The feedback voltage Vfb of the DC-DC converter 120 is a voltage applied to the output capacitor C2, and provided to the first subtractor 210.

The first PI controller 220 generates a command-value current I* by proportionally integrating the deviation voltage Vdev of the first subtractor 210, the command-value current I* being proportional to a deviation between the target command-value voltage V* and the current output voltage Vfb and obtained by accumulating the deviation.

The second subtractor 230 receives the command-value current I* outputted from the first PI controller 220 and an inductor current Ifb flowing through the inductor L1 of the DC-DC converter 120, and outputs a deviation current Idev through subtraction. As illustrated in FIG. 2, the current flowing through the inductor L1 is detected and provided to the second subtractor 230.

The second PI controller 240 generates a proportional integral control signal by proportionally integrating the deviation current Idev outputted from the second subtractor 230.

The comparator 250 generates the PWM signal by comparing the proportional integral control signal inputted to a non-inverting terminal from the second PI controller 240 to a carrier frequency inputted to an inverting terminal, and provides the generated PWM signal to the switching elements Q1 to Q4 within the DC-DC converter 120.

The high-frequency power generator in accordance with the embodiment of the present invention includes an adaptive controller 260 in the DC-DC converter controller 150, and the adaptive controller 260 receives a pulse signal Spulse from the RF power controller 140, and adjusts gains of the first and second PI controllers 220 and 240. The pulse signal Spulse inputted to the adaptive controller 260 is generated in response to an output of the RF power amplifier 130, and the gains of the first and second PI controllers 220 and 240 are adjusted according to the pulse signal Spulse. The pulse signal Spulse has a duty ratio of 1 to 98% and a frequency of 1 to 50 kHz.

Figure 3:
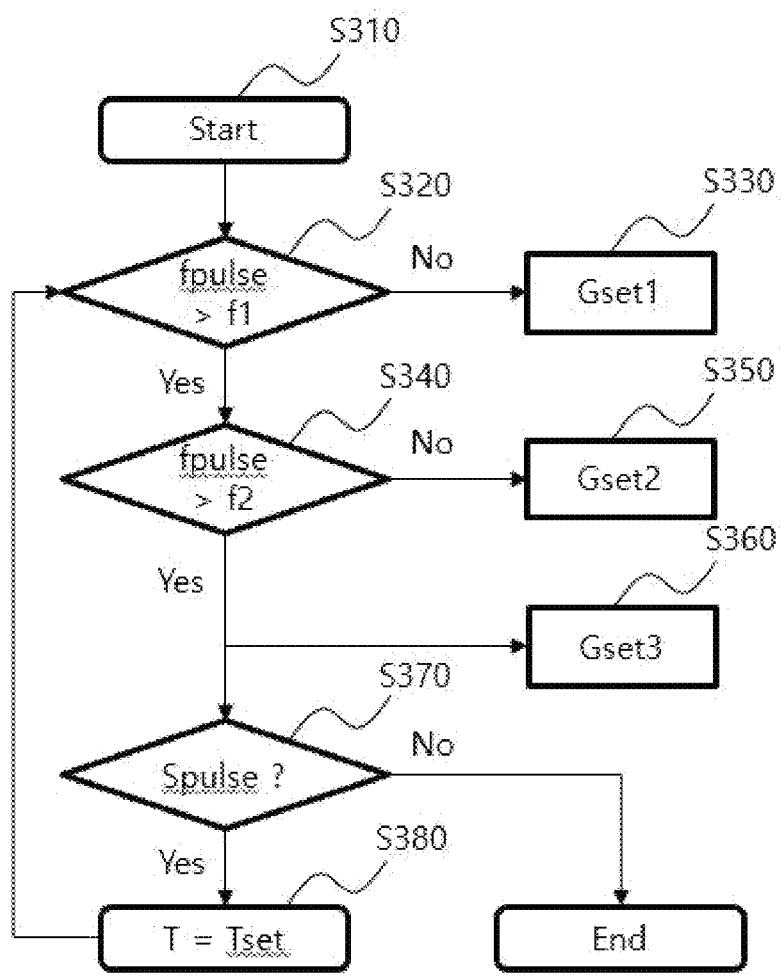
FIG. 3 is a processing flowchart of an adaptive controller in accordance with the embodiment of the present invention.

FIG. 3 is a processing flowchart of the adaptive controller in accordance with the embodiment of the present invention.

The adaptive controller 260 in accordance with the embodiment of the present invention compares the frequency fpulse of the pulse signal Spulse applied from the RF power controller 140 to a first reference frequency f1 at step S320, and outputs a first set of gains Gset1 as the gains of the first and second PI controllers 220 and 240 when the frequency fpulse of the pulse signal Spulse is lower than the first reference frequency f1, at step S330. The first reference frequency f1 may correspond to any one frequency in a low frequency band of 1.5 to 3 kHz, for example.

When the frequency fpulse of the pulse signal Spulse is higher than the first reference frequency f1, the adaptive controller 260 compares the frequency fpulse of the pulse signal Spulse to a second reference frequency f2 at step S340. When the frequency fpulse of the pulse signal Spulse is lower than the second reference frequency f2, the adaptive controller 260 outputs a second set of gains Gset2 as the gains of the first and second PI controllers 220 and 240 at step S350. The second reference frequency f2 may correspond to any one frequency in a frequency band of 3 to 8 kHz, for example, which is relatively higher than the frequency band of the first reference frequency f1.

At this time, when the frequency fpulse of the pulse signal Spulse is higher than the second reference frequency f2, the adaptive controller 260 outputs a third set of gains Gset3 as the gains of the first and second PI controllers 220 and 240 at step S360.

Then, the adaptive controller 260 determines whether the pulse signal Spulse is applied from the RF power controller 140, at step S370. When a predetermined set time Tset elapses at step S380 while the pulse signal Spulse is still applied from the RF power controller 140, the procedure returns to step S320. When the pulse signal Spulse is not applied from the RF power controller 140, the procedure is ended.

In accordance with an embodiment of the present invention, the first set of gains Gset1 may be outputted as different values from the second set of gains Gset2, and the second set of gains Gset2 may be set to different values from the third set of gains Gset3. In accordance with another embodiment of the present invention, the first set of gains Gset1 may be set to different values from the second set of gains Gset2, and the second set of gains Gset2 may be set to different values from the third set of gains Gset3.

In accordance with another embodiment of the present invention, the first set of gains Gset1 may be set to larger values than the second set of gains Gset2, and the second set of gains Gset2 may be set to larger values than the third set of gains Gset3. That is, as the frequency of the pulse signal is increased, the adaptive controller 260 may set the gain of the first and/or second PI controllers to a smaller value, thereby reducing the influence of the first and/or second PI controllers. For example, the gains of the first to third sets at this time may be summarized as shown in Table 1 below. In accordance with another embodiment of the present invention, the adaptive controller 260 may change the gain of the first PI controller while fixing the gain of the second PI controller at step S350 or S360, or change the gain of the second PI controller while fixing the gain of the first PI controller, thereby stably controlling the RF pulse output.

TABLE 1

|  | Gset1 | Gset2 | Gset3 |
|---|---|---|---|
| Gp1 | 2.5 | 1.3 | 0.7 |
| Gi1 | 300 | 150 | 75 |
| Gp2 | 1.3 | 0.8 | 0.4 |
| Gi2 | 100 | 50 | 25 |

In accordance with another embodiment of the present invention, the adaptive controller 260 may store only the first and second sets of gains Gset1 and Gset2, and omit steps S340 and S350. For example, the first and second of gains at this time may be summarized as shown in Table 2 below.

TABLE 2

|  | Gset1 | Gset2 |
|---|---|---|
| Gp1 | 2.5 | 1.3 |
| Gi1 | 300 | 150 |
| Gp2 | 1.3 | 0.8 |
| Gi2 | 100 | 50 |

FIGS. 4 to 7 are waveform diagrams comparatively illustrating the DC-DC converter inductor currents and the RF power amplifier input voltages in the conventional high-frequency power generator in which the PI gain is not varied because the adaptive controller 260 is not included and the high-frequency power generator which adaptively adjusts the PI gain in accordance with the embodiment of the present invention. Referring to FIGS. 4 to 7, the operation effect of the present invention will be described as follows.

Figure 4:
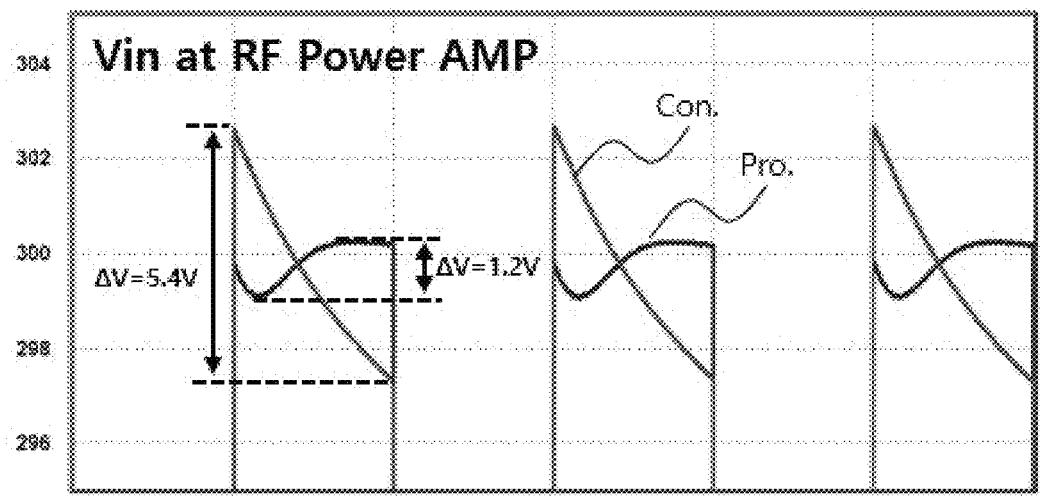
FIG. 4 is a waveform diagram comparatively illustrating DC-DC converter inductor currents of a conventional high-frequency power generator in which a PI gain is not varied and the high-frequency power generator which adaptively adjusts a PI gain in accordance with the embodiment of the present invention.
Figure 6:
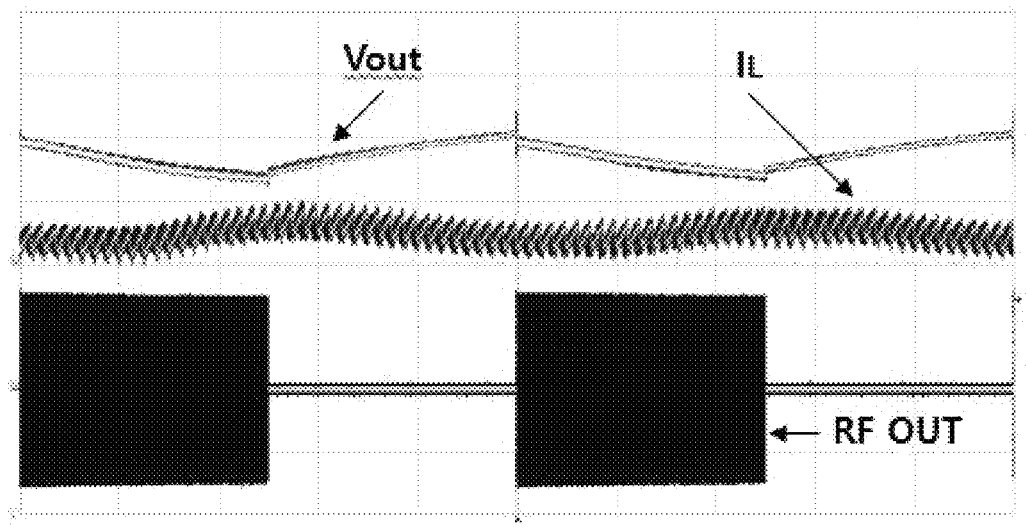
FIG. 6 is a waveform diagram illustrating the DC-DC converter inductor current and the RF power amplifier input voltage with respect to the RF pulse output in the conventional high-frequency power generator in which a PI gain is not varied.

In FIG. 4, the conventional (Con.) waveform represents the DC-DC converter inductor current IL of the conventional high-frequency power generator in which the PI gain is not varied, and FIG. 6 illustrates the inductor current IL of the conventional high-frequency power generator, which is compared to the RF pulse output of the high-frequency power generator. As illustrated in FIG. 6, the inductor current IL gently rises in an on period of the RF pulse output, and gently falls in an off period of the RF pulse output.

Figure 7:
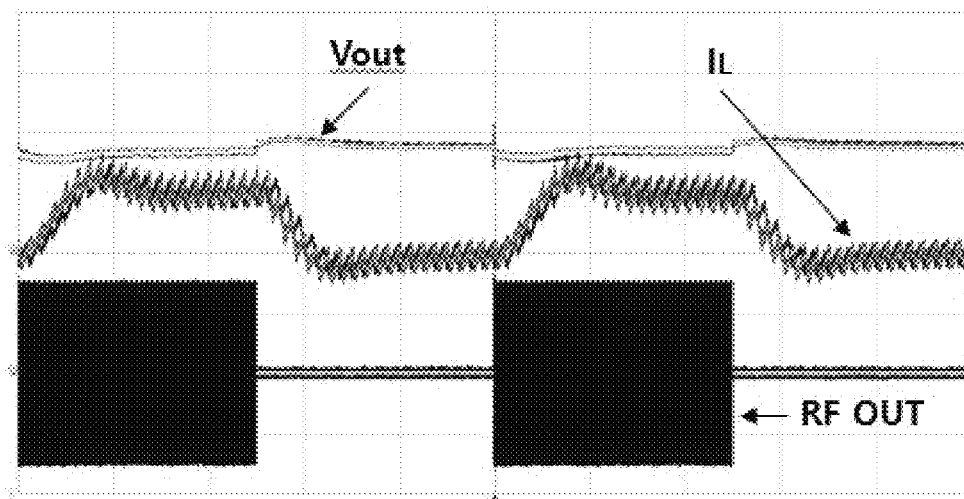
FIG. 7 is a waveform diagram illustrating the DC-DC converter inductor current and the RF power amplifier input voltage with respect to the RF pulse output in the high-frequency power generator which adaptively adjusts a PI gain in accordance with the embodiment of the present invention.

In FIG. 4, the proposed (Pro.) waveform represents the DC-DC converter inductor current IL of the high-frequency power generator which adaptively adjusts the PI gain in accordance with the embodiment of the present invention, and FIG. 7 illustrates the inductor current IL of the high-frequency power generator in accordance with the embodiment of the present invention, which is compared to the RF pulse output of the high-frequency power generator. As illustrated in FIG. 7, the inductor current rapidly rises at a rising edge in an on period of the pulse output and rapidly falls at a falling edge, similar to the RF pulse waveform.

That is, comparing the conventional converter inductor current IL and the proposed DC-DC converter inductor current IL, the proposed DC-DC converter inductor current IL has a waveform close to a square wave, similar to the RF pulse output.

Figure 5:
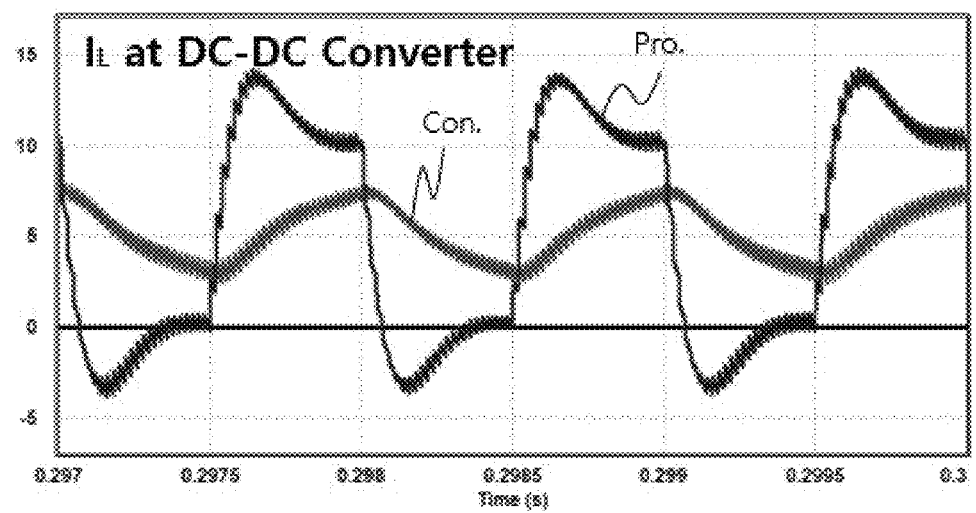
FIG. 5 is a waveform diagram comparatively illustrating RF power amplifier input voltages of the conventional high-frequency power generator in which a PI gain is not varied and the high-frequency power generator which adaptively adjusts a PI gain in accordance with the embodiment of the present invention.

In FIG. 5, the conventional (Con.) waveform represents the RF power amplifier input voltage of the conventional high-frequency power generator in which the PI gain is not varied. Compared to the waveform diagram of FIG. 6, the input voltage has a large difference between rising and falling edges of the RF pulse output, and an input voltage variation of about 5.4V was measured under the same experiment condition excluding the adaptive controller 260.

In FIG. 5, the proposed (Pro.) waveform represents the RF power amplifier input voltage of the high-frequency power generator which adaptively adjusts the PI gain in accordance with the embodiment of the present invention. Compared to the waveform diagram of FIG. 6, the input voltage does not have a large difference between rising and falling edges of the RF pulse output, and an input voltage variation of about 1.2V was measured in this waveform measurement. That is, the result shows that the variation rate of the input voltage has been significantly reduced.

As described above, the high-frequency power generator with an enhanced pulse function receives the pulse signal corresponding to the pulse output as well as the voltage command from the RF power controller, and adjusts the gains of the two-stage PI controllers.

The current flowing through the inductor of the DC-DC converter may be adjusted adaptively to the pulse waveform and thus have clear rising and falling periods, and the output voltage of the DC-DC converter, i.e. the input voltage variation rate of the RF power amplifier can be significantly reduced. Therefore, the high-frequency power generator can have consecutive output characteristics by stably controlling an output of the DC-DC converter during a high-pulse operation, and prevent an overshoot or undershoot in the pulse output even though a load variation occurs in various manners, which makes it possible to provide a high-frequency power generator suitable for a fine semiconductor process.

While various embodiments have been described above, it will be understood to those skilled in the art that the embodiments described are by way of example only. Accordingly, the disclosure described herein should not be limited based on the described embodiments.

What is claimed is:

1. A high-frequency power generator with an enhanced pulse function, which supplies high-frequency power to a plasma load, comprising:
   a rectifier configured to receive AC power and rectify the received AC power;
   a DC-DC converter configured to adjust an output voltage by switching an output of the rectifier;
   an RF power amplifier configured to amplify an output of the DC-DC converter, and transfer high-frequency power with a pulse waveform to the plasma load;
   an RF power controller configured to control the output and pulse waveform of the RF power amplifier; and
   a DC-DC converter controller configured to receive a pulse signal from the RF power controller, and control a duty ratio of switching elements constituting the DC-DC converter,
   wherein the DC-DC converter controller comprises:
   a first subtractor configured to calculate a difference between a voltage command received from the RF power controller and the output voltage of the DC-DC converter by comparing the voltage command to the output voltage;
   a first PI controller configured to proportionally integrate an output of the first subtractor;
   a second subtractor configured to calculate a difference between an output of the first PI controller and an inductor current flowing through an inductor of the DC-DC converter by comparing the output of the first PI controller to the inductor current;
   a second PI controller configured to proportionally integrate an output of the second subtractor;
   a comparator configured to generate a PWM signal by comparing an output of the second PI controller to a carrier frequency, and provide the generated PWM signal to the switching elements constituting the DC-DC converter; and
   an adaptive controller configured to receive a pulse signal corresponding to the output of the RF power amplifier from the RF power controller, and adjust gains of the first and second PI controllers.

2. The high-frequency power generator of claim 1, wherein the DC-DC converter comprises a cascade buck-boost converter.

3. The high-frequency power generator of claim 2, wherein the DC-DC converter comprises an input capacitor connected in parallel to an input terminal, first and second switching elements connected in series to the input terminal, third and fourth switching elements connected in series to an output terminal, the inductor having one terminal connected to a contact between the first and second switching elements and the other terminal connected to a contact between the third and fourth switching elements, and an output capacitor connected in parallel to the output terminal.

4. The high-frequency power generator of claim 2, wherein the adaptive controller compares the frequency of the pulse signal applied from the RF power controller to a first reference frequency, outputs a first set of gains as the gains of the first and/or second PI controllers when the frequency of the pulse signal is lower than the first reference frequency, and outputs a second set of gains as the gains of the first and/or second PI controllers when the frequency of the pulse signal is higher than the first reference frequency.

5. The high-frequency power generator of claim 4, wherein the first set of gains is larger than the second set of gains.

6. The high-frequency power generator of claim 4, wherein as the frequency of the pulse signal is higher, the gains of the first and/or second PI controllers are decreased.

* * * * *